United States Patent [19]

Swamy

[11] Patent Number: 5,459,287
[45] Date of Patent: Oct. 17, 1995

[54] SOCKETED PRINTED CIRCUIT BOARD BGA CONNECTION APPARATUS AND ASSOCIATED METHODS

[75] Inventor: Deepak Swamy, Austin, Tex.

[73] Assignee: Dell USA, L.P.

[21] Appl. No.: 245,729

[22] Filed: May 18, 1994

[51] Int. Cl.[6] .................................................. H05K 1/00
[52] U.S. Cl. .................. 174/266; 174/250; 174/260; 174/262; 361/760; 361/777
[58] Field of Search .................................. 174/250, 256, 174/257, 258, 260, 262, 266; 361/760, 773, 774, 772, 762, 777

[56] References Cited

U.S. PATENT DOCUMENTS 3,999,004  12/1976  Chirino et al. .
4,729,061  3/1988   Brown .
4,893,216  1/1990   Hagner .
5,355,283  10/1994  Marrs et al. .

Primary Examiner—Leo P. Picard
Assistant Examiner—Cheryl R. Figlin
Attorney, Agent, or Firm—J. Richard Konneker; James Huffman

[57] ABSTRACT

To facilitate the registered connection between a BGA package and an associated multi-tiered circuit board, a spaced series of vias are formed transversely through the board substrate between its opposite first and second sides. A spaced series of relatively shallow, circularly cross-sectioned socket areas, offset from the vias, are also formed on the first side of the circuit board. The sockets have diameters slightly larger that those of the generally ball-shaped leads of the BGA package, and are positioned on the same centerline pattern as the leads. After the vias and sockets are formed, a metal plating material is deposited on their interiors and around their open ends on the first board side, with the plating being extended across the first board side between associated socket and via pairs. A solder mask is then extended along the first board side, outwardly over the plating material thereon, the mask having circular cutout areas coaxial with the plated sockets and having diameters slightly larger than the diameters of the plated sockets. Using a high precision pick and place machine, the BGA package is placed against the first board side in a manner causing the BGA leads to partially enter the plated sockets, the sockets facilitating the registration between the BGA leads and the lead connection areas of the plating material. Finally, the socket-received BGA leads are soldered to the plating portions of their associated sockets.

8 Claims, 3 Drawing Sheets

SOCKETED PRINTED CIRCUIT BOARD BGA CONNECTION APPARATUS AND ASSOCIATED METHODS

BACKGROUND OF THE INVENTION

The present invention relates generally to circuit board construction, and more particularly relates to apparatus and methods for operatively connecting an electronic component ball grid array ("BGA") to a circuit board.

For many years it has been customary to employ printed circuit boards ("PCBs") or printed circuit assemblies ("PCAs") as mediums for mechanically holding electronic components together and providing operative electrical interconnections between the components. The earliest PCBs were constructed of an insulating planar substrate (such as a glass fiber/resin combination) upon which a layer of conductive metal was deposited. The metal coating layer typically covered the entire surface of the substrate and was subsequently etched by a chemical process to form from the initial metal coating layer a predetermined pattern of conductive "traces" on the side surface of the substrate. Often, these electrically conductive traces were formed on both sides of the substrate to allow conductors to cross without coming into contact with one another. A plurality of mounting holes or "vias" were drilled through the metal layer(s) and the substrate, and were appropriately positioned to receive leads from the electronic components. This method of mounting electrical components on a circuit board is commonly referred to as "through-hole" mounting.

To complete assembly of a circuit board, the electronic components were placed on the PCB, either by hand or robotic machine, with the leads of the components passing through corresponding vias. Finally, solder connections were made to ensure reliable electrical contact between the components and the traces.

Initially, soldering was performed manually. Subsequently, more efficient machine-soldering techniques employing infrared ovens or solder baths were developed to speed manufacture of circuit boards and to ensure higher solder joint reliability. Under such machine-soldering techniques, the PCB and its components were heated while solder, under the influence of flux, was caused to contact the board and flow by capillary action into the vias, yielding a low resistance solder joint when cooled.

As circuit board technology developed, designers began to create circuit boards comprising many alternating substrate and conductive layer pairs, resulting in sandwiched circuit boards that could accommodate a higher component density. Such boards could accommodate ten or more conductive layers. Later, surface-mount technology allowed the leads to be soldered to solder pads on the surface of the circuit board, rather than requiring the leads to pass through vias to be soldered therein.

In addition to this circuit board construction evolution, the electronic components themselves underwent changes to accommodate higher density. First, discrete components were combined into integrated circuits ("ICs"). ICs were originally placed in dual in-line packages ("DIPs") each consisting of an elongated plastic body encapsulating the IC and a plurality of electrical leads coupled to the IC and arranged in a series extending from the two long edges of the body. The leads could either be through-hole soldered or surface-mounted. Unfortunately, the number of leads that a DIP could accommodate was a function of twice the length of the DIP body edges. Some improvement was made by providing packages having leads extending from all four edges of the body, but, even so, the number of leads was a function of the perimetral length of the body edges.

Next, in an effort to increase lead density further (to address, in particular, the increasing power and density of microprocessors and the stringent space requirements of notebook, subnotebook and personal digital assistant ("PDA") computers), designers developed quad flat packs ("QFPs") comprising a generally square body having leads extending downward from the lower surface of the body. The leads were typically arranged in multiple rows and columns, allowing the QFPs to accommodate more pins than DIPs. However, limitations in socket size and collective lead insertion force began to be problematical.

Currently, designers are focussing on ball grid array ("BGA") packaging wherein leads are dispensed with and replaced with a finely-pitched matrix of conductive contact surfaces on the lower surface of an otherwise conventional body. The circuit board to which a BGA package is to be mounted is conventionally provided with a matrix of corresponding surface mounted flat pad structures upon each of which is deposited a small quantity of solder. To mount the BGA package to the circuit board, the BGA package is temporarily clamped to the board and the board heated (typically by application of infrared energy), causing the solder to melt, fusing the corresponding surfaces together and yielding a strong mechanical and electrical connection when cooled.

BGA packaging is proving to be a powerful ally in the further miniaturization of computers. However, the circuit boards designed to receive the BGAs are lagging in compactness. The problem centers on how to route the electrical conductors from each BGA pad through the circuit board.

In multi-layer boards, electrical signals are routed from layer to layer by metal-coated vias. Accordingly, a via is required for each pad to communicate electrical signals between the pad to a trace on another layer of the board. At the present time, most conventional circuit board designs employ a matrix of vias that is spatially offset from the matrix of electrically conductive flat surface pads and coupled thereto by short traces.

In connecting a BGA electronic component package to the circuit board, the BGA package is typically placed on the appropriate side of the circuit board, using a high accuracy "pick and place" machine, in a manner such that the ball shaped lead portions of the BGA package contact the flat, surface mounted solder pads. The partially completed circuit board/BGA package structure is them subjected to an infrared solder reflow process to mechanically and electrically couple the surface pads to the ball shaped lead portions of the BGA package.

Despite the fact that the ball-shaped configurations of the BGA lead portions allows for a certain degree of self-centering due to surface tension during the solder reflow process, there are practical limitations to the maximum tolerable centering offset between the pads and BGA leads. Additionally, this desirable self-centering effect provided by the ball-shaped configuration of the BGA lead portions tends to be substantially diminished by even slight nonplanarities in either or both of the circuit board and BGA package. These positioning offset and planarity problems, of course, tend to significantly increase the probability of having to rework a significant portion of the fabricated circuit board/BGA package assemblies, thereby undesirably increasing assembly yield and cost.

As can readily be seen from the foregoing, it would be highly desirable to provide improved apparatus and methods for operatively connecting a BGA electronic component structure to a circuit board in a manner eliminating or at least substantially reducing the above-mentioned problems, limitations and disadvantages typically associated with conventional connection apparatus and methods. It is thus an object of the present invention to provide such improved connection apparatus and methods.

SUMMARY OF THE INVENTION

In carrying out principles of the present invention, in accordance with a preferred embodiment thereof, a circuit board is provided with improved apparatus for operatively connecting the circuit board to a BGA package. The circuit board includes a substrate structure having first and second opposite sides. A spaced series of vias extend transversely through the substrate structure between its opposite first and second sides, and a spaced series of socket areas are offset from the vias and extend only partially through the substrate structure from its first side. The vias and socket areas are preferably formed by a precision drilling process.

A metal plating material, preferably copper, is deposited on the interiors of the vias and the socket areas and around their open ends of the first substrate side. Mutually spaced portions of the plating material extend across the first substrate side between associated via/socket area pairs to electrically couple them. The plated socket areas are relatively oriented to partially receive and be soldered to a spaced array of generally ball-shaped lead portions externally disposed on the BGA package to be operatively connected to the circuit board.

Preferably, the socket areas have circular cross-sections and have diameters slightly larger than the diameters of the BGA lead portions. Additionally, the socket areas are relatively oriented so as to be registrable with the array of BGA lead portions. Prior to the connection of the BGA package to the circuit board, a solder mask is positioned along the first substrate structure side outwardly over the metal plating portions thereon. The solder mask has a spaced series of circular cutout areas disposed thereon which are concentric with the socket areas and have diameters somewhat larger than the diameters of the socket areas.

To attach the BGA package to the circuit board, the BGA package is positioned along the first substrate side, with the BGA lead portions extending inwardly through the solder mask cut out areas and being in registry with and partially received in the metal-plated socket areas. Finally, the BGA lead members are soldered to the metal plating portions of their associated socket areas.

The socketed configurations of the BGA connection portions of the circuit board substantially facilitate an automatic registry between the BGA lead portions and such connection portions during the initial pre-soldering placement of the BGA package on the circuit board substrate, and the socket areas further act as solder wells to inhibit solder wicking between the socket areas and their associated vias.

DETAILED DESCRIPTION

Figure 1:
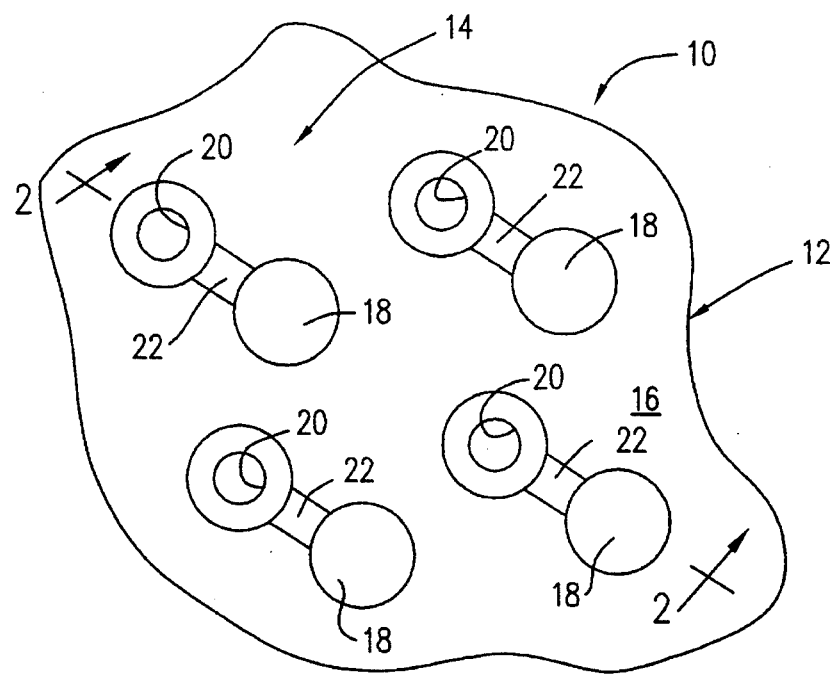
FIG. 1 (PRIOR ART) is a top plan view of a portion of conventional circuit board having offset arrays of electrically coupled vias and flat, surface mounted solder pads formed thereon.

Illustrated in top plan view in FIG. 1 (PRIOR ART) is a portion of a representative circuit board 10 having a substrate portion 12 with conventional ball grid array ("BGA") connection circuitry 14 formed on a side surface 16 thereof. The connection circuitry 14 includes a spaced array of circular solder pads 18 that are offset from a corresponding spaced array of metallically lined vias 20 and electrically coupled thereto by a series of interstitial electrically conductive surface traces 22.

Figure 2:
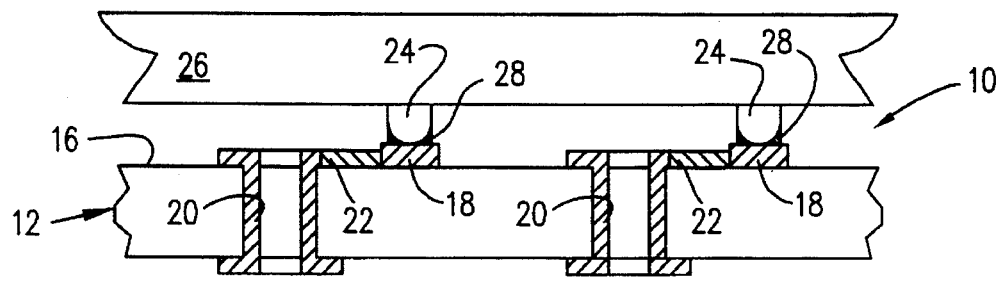
FIG. 2 (PRIOR ART) is a cross-sectional view through the circuit board taken along line 2—2 of FIG. 1.

The pads 18, as illustrated in FIG. 2 (PRIOR ART) are used as circuit board connection areas for the generally ball-shaped lead portions 24 depending in a mutually spaced, finely-pitched array from the underside of a representative BGA package 26 and arranged to be registrable with the pads 18 on the circuit board substrate 12. Using a high accuracy pick and place machine (not shown), the package 26 is positioned against the circuit board in a manner such that the ball-shaped leads 24 engage the top sides of the metallic solder pads 18. A conventional IR solder reflow process is used to solder the BGA leads 24 to the underlying surface mounted pads 18 as at 28.

While the use of the ball-shaped leads 24 provides a small degree of self-centering of the leads 24 on their associated solder pads 18, this self-centering characteristic of the BGA/surface pad connection structure tends to be for the most part defeated by even relatively minor planarity disparities between the top surfaces of the pads 18 and the undersides of the ball shaped BGA leads 24.

Figure 3A:
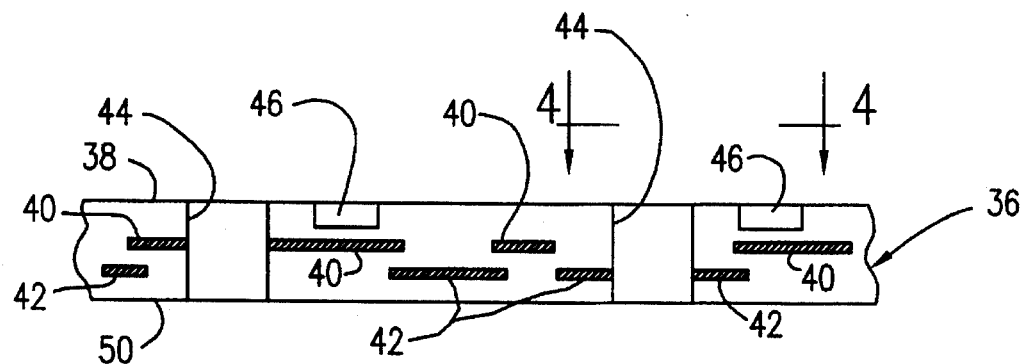
FIGS. 3A–3C are simplified cross-sectional views through an improved circuit board embodying principles of the present invention and sequentially illustrating the construction of the board and the operative connection of BGA electronic component structure thereto.
Figure 3B:
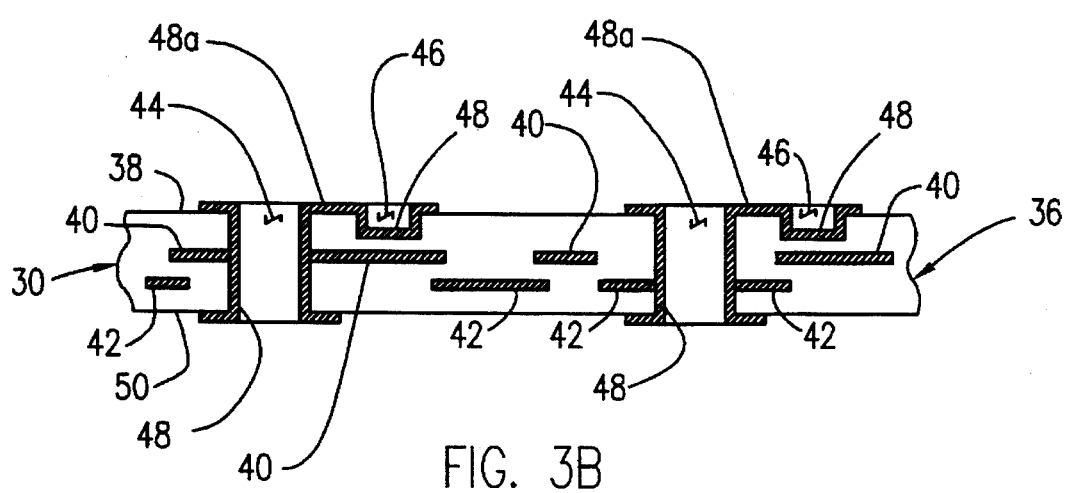
Figure 3C:
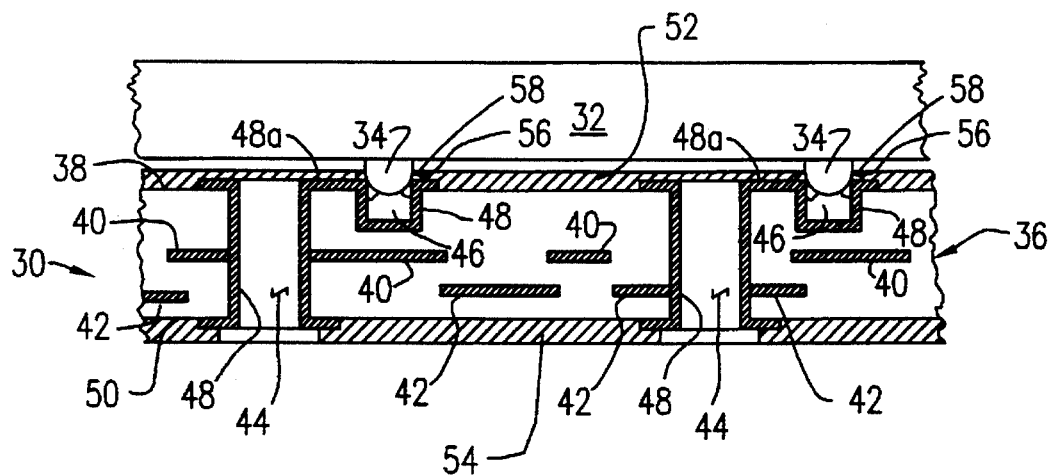
Figure 4:
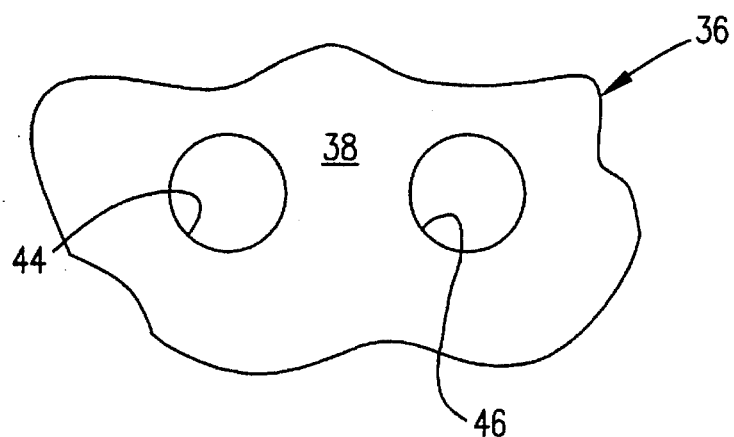
FIG. 4 is a top plan view of a portion of the partially completed circuit board taken along line 4—4 of FIG. 3A.

FIGS. 3A–3C sequentially illustrate the formation of an improved circuit board 30 (see FIGS. 3B and 3C) and the operative connection of the completed circuit board to a representative BGA package 32 having a mutually spaced array of ball-shaped lead portions 34 depending from its underside. As will be seen, a unique configuration of the BGA connection portion of the circuit board 30 serves as registration means for facilitating the proper alignment between the BGA leads 34 and the associated connection portion of the circuit board 30.

Referring now to FIG. 3A, the fabrication of the improved circuit board 30 is begun by forming an insulative substrate member 36 that has a top side 38. Representatively, the substrate member 36 is of a laminated construction in which a plurality of interior "tiers" of circuitry portions 40,42 are operatively disposed. After the formation of the laminated substrate member 36, a spaced series of circularly cross-sectioned vias 44 are formed transversely through the substrate member, between its opposite sides, using precision drilling apparatus. As illustrated, the vias 44 are positioned to intersect facing end sections of selected interior circuit portions 40 and 42.

With the same precision drilling apparatus used to form the vias 44 a spaced series of relatively shallow, circularly cross-sectioned sockets 46 are formed in the top side 38 of the substrate structure 36. The sockets 46 have diameters just slightly larger than the diameters of the BGA lead members 34, are offset from the vias 44, and are positioned on centerlines registrable with the centerlines of the BGA lead members 34.

Next, as illustrated in FIG. 3B, the interiors of each via 44 and its associated adjacent socket 46 are plated with a metallic material 48, representatively a copper plating material, using a standard outer layering process. In addition to extending along the interior surfaces of the vias 44 and the sockets 46, the plating material 48 extends along the top side 38 of the substrate structure 36 at the open top ends of the vias 44 and the sockets 46, and along the bottom side 50 of the substrate structure 36 around the open bottom ends of the vias 40. Interstitial portions 48a of the plating material 48 extend along the top substrate side 38 between the plating material of each via 44 and the plating material of its associated socket 46.

Referring now to FIG. 3C, after the metallic plating of the vias 44 and their associated sockets 46 solder masking structures 52,54 are respectively placed on the top and bottom sides 38,50 of the substrate structure 36. The upper solder mask 52, which extends outwardly over the plating material portions on the top side of the substrate structure 36, has circular cutout areas 56 that are concentric with, and slightly larger in diameter than, the plated sockets 46.

With the solder masks 52 and 54 in place, the BGA package 32 is positioned on the top side of the masked substrate 36 (using a high accuracy pick and place machine) in a manner such that the BGA leads register with the plated sockets 46 and partially enter them as illustrated in FIG. 3C. To complete the fabrication of the improved circuit board 30 the leads 34 are then soldered, as at 58, to the metal plating 48 of the sockets 46 that partially receive the leads 34.

During the placement of the BGA package 32 in its to-be-soldered orientation on the completed circuit board 30, the plated sockets 46 act as registration wells to facilitate the precise orientation of the ball-shaped BGA leads 34 relative to the plated vias 44. In addition to providing lead self-centering characteristics markedly superior to the conventional flat surface pads 18 shown in FIGS. 1 and 2, the plated sockets 46 also tend to more reliably compensate for planarity deviations between the top side 38 of the substrate 36 and the bottom sides of the ball-shaped BGA leads 34. Further, the plated sockets 46 act as solder dams to prevent solder wicking between adjacent socket/via pairs.

As will be readily appreciated from the foregoing description, in a relatively simple, inexpensive manner the construction of the improved circuit board 30 enables better package-to-board registration that results in reduced rework, increased yield and lowered assembly costs using standard printed circuit board and assembly manufacturing toolsets.

The foregoing detailed description is to be clearly understood as being given by way of illustration and example only, the spirit and scope of the present invention being limited solely by the appended claims.

What is claimed is:

1. Circuit board apparatus comprising:

a BGA package having a generally planar side upon which are disposed a spaced series of outwardly projecting, generally ball-shaped lead portions having diameters;

a circuit board substrate structure having first and second opposite sides, said circuit board substrate structure having a spaced series of circularly cross-sectioned vias extending transversely therethrough between said first and second opposite sides, and further having a spaced series of circularly cross-sectioned socket areas offset from said spaced series of vias and extending only partially through said substrate structure from said first side thereof, said socket areas having diameters slightly greater than the diameters of said ball-shaped lead portions of said BGA package; and a metal plating material deposited on the interior side surfaces of said vias and said socket areas and around their open ends on said first side of said substrate structure, portions of said plating material being extended across said first side between associated via/socket area pairs to electrically couple them, the portions of said metal plating material disposed on the side surfaces of said socket areas having interior diameters less than said diameters of said ball-shaped lead portions of said BGA package, said BGA package and said circuit board substrate being operatively interconnected with said ball-shaped lead portions being aligned with and partially received in said socket areas, with said ball-shaped lead portions engaging and being soldered to outer end edge sections of the portions of said metal plating material disposed on the side surfaces of said socket areas.

2. The circuit board apparatus of claim 1 wherein:

said vias and said socket areas are drill holes.

3. The circuit board apparatus of claim 1 wherein:

said plating material is copper.

4. The circuit board apparatus of claim 1 wherein:

said substrate structure is of a laminated, multi-tier construction.

5. The circuit board apparatus of claim 1 further comprising:

a solder mask extending along said first side of said substrate structure outwardly over said metal plating material thereon, said colder mask having cutout areas thereon that overlie and are in registry with said socket areas.

6. The circuit board apparatus of claim 5 wherein:

said cutout areas are circularly cross-sectioned, are concentric with the plated socket areas, and have diameters larger that the interior diameters of the plated socket areas.

7. Circuit board apparatus fabricated by a method comprising the steps of:

providing a circuit board substrate structure having first and second opposite sides;

forming in said substrate structure a spaced series of vias extending transversely therethrough between said first and second opposite sides;

forming in said substrate structure a spaced series of circularly cross-sectioned socket areas offset from said spaced series of vias and extending only partially through said substrate structure from said first side thereof, said socket areas having diameters;

depositing a metal plating material on the interiors of said vias and said socket areas and around their open ends on said first side of said substrate structure, portions of the deposited plating material extending across said first side between associated via/socket area pairs in a manner electrically coupling the pairs, the sections of metal plating material lining the interior side surfaces of said socket areas having interior diameters;

providing a BGA package having a side from which a spaced series of generally ball-shaped lead portions externally project, said spaced series of generally ball-shaped lead portions being registrable with said spaced series of socket areas and having diameters greater that said interior diameters of said sections of metal plating material lining the interior side surfaces of said socket areas;

aligning said generally ball-shaped lead portions with said socket areas in a facing relationship therewith;

inserting said generally ball-shaped lead portions partially into said socket areas in a manner bringing said lead portions into contact with outer end edge portions of said sections of metal plating material lining the interior side surfaces of said socket areas; and soldering said generally ball-shaped lead portions to said outer end edge portions of said sections of metal plating material lining the interior side surfaces of said socket areas.

8. The circuit board apparatus of claim 7 fabricated by a method further comprising the step of:

positioning a solder mask along said first side of said substrate structure outwardly over said metal plating material thereon, said solder mask having circular cutout areas thereon that overlie and are in registry with said socket areas and have diameters larger than the interior diameters of said sections of metal plating material lining the interior side surfaces of said socket areas.

\* \* \* \* \*